(12) United States Patent
Li et al.

(10) Patent No.: US 8,466,478 B2
(45) Date of Patent: Jun. 18, 2013

(54) LIGHT EMITTING DEVICE UTILIZING ROD STRUCTURE

(75) Inventors: Meng Hsin Li, Tainan (TW); Kuo Hui Yu, Tainan (TW); Tsung-Hung Lu, Tainan (TW); Ming-Ji Tsai, Tainan (TW); Chang Hsin Chu, Tainan (TW)

(73) Assignee: Chi Mei Lighting Technology Corporation, Tainan (TW)

( * ) Notice: Subject to any disclaimer, the term of this patent is extended or adjusted under 35 U.S.C. 154(b) by 219 days.

(21) Appl. No.: 12/876,850

(22) Filed: Sep. 7, 2010

(65) Prior Publication Data

US 2012/0056152 A1 Mar. 8, 2012

(51) Int. Cl.
*H01L 33/00* (2010.01)

(52) U.S. Cl.
USPC ............... 257/98; 257/E33.067; 438/29

(58) Field of Classification Search
USPC .................. 257/98, E33.067, E33.068
See application file for complete search history.

(56) References Cited

U.S. PATENT DOCUMENTS

| | | | |
|---|---|---|---|
| 2007/0257269 A1* | 11/2007 | Cho et al. | 257/95 |
| 2007/0272937 A1* | 11/2007 | Sakamoto et al. | 257/98 |
| 2011/0266577 A1* | 11/2011 | Kim et al. | 257/98 |

FOREIGN PATENT DOCUMENTS

| | | | |
|---|---|---|---|
| JP | 2010098234 A | * | 4/2010 |
| WO | WO 2010077070 A2 | * | 7/2010 |

OTHER PUBLICATIONS

Kim et al. "A study of transparent indium tin oxide (ITO) contact to p-GaN." Thin Solid Films, 398-399 (2001) pp. 87-92.*

* cited by examiner

*Primary Examiner* — Wensing Kuo
(74) *Attorney, Agent, or Firm* — Morris Manning & Martin LLP; Tim Tingkang Xia, Esq.

(57) ABSTRACT

In one aspect of the invention, a light emitting device includes an epi layer having multiple layers of semiconductors formed on a substrate, a first electrode and a second electrode having opposite polarities with each other, and electrically coupled to corresponding semiconductor layers, respectively, of the epi layer, and a rod structure formed on the epi layer. The rod structure includes a plurality of rods distanced from each other.

17 Claims, 11 Drawing Sheets

LIGHT EMITTING DEVICE UTILIZING ROD STRUCTURE

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to a light emitting device, and more particular to a light emitting device that utilizes a rod structure to improve the light extraction efficiency.

BACKGROUND OF THE INVENTION

Light emitting diodes (LEDs) have been widespread used for lighting with great brightness. Typically, an LED includes a multilayered structure having a p-type semiconductor, an n-type semiconductor and an active layer sandwiched between the p- and n-type semiconductors, p- and n-electrodes placed on the surfaces of the multilayered structure. In operation, a current is injected into the LED from the p- and n-electrodes, which spreads into the respective semiconductor layers. Light is generated when the current flows across the active layer because of the recombination of minority carriers at the active layer. Generally, the generated light from the active layer may be reflected to different degrees, thereby degrading the light extraction efficiency.

In order to improve the light extraction efficiency, microstructures formed on a surface where the light exits outside are usually employed to reduce the light reflection. However, the microstructures are usually formed by photolithography and/or etching, which inevitably increases the complexity and cost of manufacturing. On the other hand, when the generated light from the active layer is transmitted to the metal p- and/or n-electrodes, most of the transmitted light may be absorbed therein, which reduces the light emission efficiency.

Therefore, a heretofore unaddressed need exists in the art to address the aforementioned deficiencies and inadequacies.

SUMMARY OF THE INVENTION

In one aspect, the present invention relates to a light emitting device. In one embodiment, the light emitting device includes a substrate, a buffer layer formed on the substrate, a first-type semiconductor layer formed on the buffer layer, an active layer formed on the first-type semiconductor layer such that the first-type semiconductor layer has an exposed area, a second-type semiconductor layer formed on the active layer, a contact layer formed on the second-type semiconductor layer, a rod structure 170 formed on at least one of the contact layer and the exposed area of the first-type semiconductor layer, a second-type electrode formed on the contact layer, and a first-type electrode formed on the exposed area of the first-type semiconductor layer. The active layer comprises multiple quantum wells (MQWs).

In one embodiment, the buffer layer is formed of un-doped InAlGaN. The first-type semiconductor layer is formed of n-type InAlGaN, and the second-type semiconductor layer is formed of p-type InAlGaN.

In one embodiment, the light emitting device may further include an un-doped InAlGaN layer formed on the buffer layer. The first-type semiconductor layer is formed on the un-doped InAlGaN layer.

The contact layer is formed of a transparent conductive oxide including ITO, ZnO, AZO, GZO, $In_2O_3$, $SnO_2$, or a combination of them.

The rod structure is formed of a transparent material. In one embodiment, the transparent material comprises a transparent conductive oxide including ITO, ZnO, AZO, GZO, $In_2O_3$, $SnO_2$, or a combination of them. In another embodiment, the transparent material comprises SiN, $SiO_2$, $TiO_2$, $Al_2O_3$, or a combination of them.

The rod structure is formed by a process of chemical vapor deposition, evaporation, sputtering deposition, hydrothermal deposition, photolithography, etching, or thermal oxidation. In one embodiment, the rod structure is formed by the process comprising evaporation or sputtering under a temperature in a range of about 25-400° C., and a flow rate of oxygen at a range of about 0-10 sccm.

In one embodiment, the rod structure comprises a plurality of rods distanced from each other. The plurality of rods has an averaged distance in a range of about 10-1000 nm, an average diameter in a range of about 10-1000 nm, and an average height in a range of about 10-2000 nm. In one embodiment, the plurality of rods is formed surrounding the second-type electrode and the first-type electrode, respectively. In another embodiment, the plurality of rods is formed in a desired pattern in the contact layer. In yet another embodiment, the plurality of rods is formed in the exposed area of the first-type semiconductor layer. In a further embodiment, the plurality of rods is formed in the exposed area of the first-type semiconductor layer and surrounding the first-type electrode.

In another aspect, the present invention relates to a light emitting device. In one embodiment, the light emitting device includes a substrate having a first surface and an opposite, second surface, a buffer layer formed on the second surface of the substrate, a distributed Bragg reflector (DBR) layer formed on the buffer layer, a first-type semiconductor layer formed on the DBR layer, an active layer formed on the first-type semiconductor layer, a second-type semiconductor layer formed on the active layer, a light extraction layer formed on the second-type semiconductor layer, a contact layer formed on the light extraction layer, a rod structure formed on a portion of the contact layer, a first-type electrode formed on the first surface of the substrate, and a second-type electrode formed on the contact layer.

In one embodiment, the first-type semiconductor layer is formed of n-type InAlGaP, and the second-type semiconductor layer is formed of p-type InAlGaP. The active layer comprises MQWs. The contact layer is formed of a second-type semiconductor of ITO or a semiconductor of AuBe.

The rod structure is formed of a transparent material. In one embodiment, the transparent material comprises a transparent conductive oxide including ITO, ZnO, AZO, GZO, $In_2O_3$, $SnO_2$, or a combination of them. In another embodiment, the transparent material comprises SiN, $SiO_2$, $TiO_2$, $Al_2O_3$, or a combination of them.

The rod structure is formed by a process of chemical vapor deposition (CVD), evaporation, sputtering deposition, hydrothermal deposition, photolithography, etching, or thermal oxidation. In one embodiment, the rod structure is formed by the process comprises evaporation or sputtering under a temperature in a range of about 25-400° C., and a flow rate of oxygen at a range of about 0-10 sccm.

In one embodiment, the rod structure comprises a plurality of rods distanced from each other. The plurality of rods has an averaged distance in a range of about 10-1000 nm, an average diameter in a range of about 10-1000 nm, and an average height in a range of about 10-2000 nm.

In one embodiment, the plurality of rods is formed surrounding the second-type electrode. In another embodiment, the plurality of rods is formed in a desired pattern on the portion of the contact layer.

In yet another aspect, the present invention relates to a light emitting device. In one embodiment, the light emitting device includes a substrate, a bonding layer formed on the substrate, a reflector formed on the bonding layer, a transparent conductive layer formed on the reflector, a second-type semiconductor layer formed on the transparent conductive layer, an active layer formed on the second-type semiconductor layer, a first-type semiconductor layer formed on the active layer, a rod structure formed on the first-type semiconductor layer, a first-type electrode electrically coupled to the first-type semiconductor layer, and a second-type electrode formed an additional substrate and electrically coupled to the second-type semiconductor layer.

In one embodiment, the light emitting device further includes an ohmic contact layer formed between the reflector and the transparent conductive layer. The light emitting device may also include the transparent conductive nitrogen oxide layer formed first-type semiconductor layer, and the first-type electrode is formed on the transparent conductive nitrogen oxide layer.

In one embodiment, the first-type semiconductor layer is formed of n-type InAlGaN, and wherein the second-type semiconductor layer is formed of p-type InAlGaN. The active layer comprises MQWs.

The rod structure is formed of a transparent material. In one embodiment, the transparent material comprises a transparent conductive oxide including ITO, ZnO, AZO, GZO, $In_2O_3$, $SnO_2$, or a combination of them. In another embodiment, the transparent material comprises SiN, $SiO_2$, $TiO_2$, $Al_2O_3$, or a combination of them.

The rod structure is formed by a process of chemical vapor deposition (CVD), evaporation, sputtering deposition, hydrothermal deposition, photolithography, etching, or thermal oxidation. In one embodiment, the rod structure is formed by the process comprising evaporation or sputtering under a temperature in a range of about 25-400° C., and a flow rate of oxygen at a range of about 0-10 sccm.

In one embodiment, the rod structure comprises a plurality of rods distanced from each other. The plurality of rods has an averaged distance in a range of about 10-1000 nm, an average diameter in a range of about 10-1000 nm, and an average height in a range of about 10-2000 nm.

In one embodiment, the plurality of rods is formed surrounding the first-type electrode. In another embodiment, the plurality of rods is formed in a desired pattern in the transparent conductive nitrogen oxide layer.

In a further aspect, the present invention relates to a light emitting device. In one embodiment, the light emitting device includes a substrate, a bonding layer formed on the substrate, an ohmic contact layer formed on the bonding layer, a second-type semiconductor layer formed on the ohmic contact layer, an active layer formed on the second-type semiconductor layer such that the second-type semiconductor layer has an exposed area, a first-type semiconductor layer formed on the active layer, a contact layer formed on the first-type semiconductor layer, a rod structure formed on at least one of the exposed area of the second-type semiconductor layer and the contact layer, a first-type electrode formed on the contact layer, and a second-type electrode formed on the exposed area of the second-type semiconductor layer and electrically connected to the ohmic contact layer through a via. The contact layer is formed of a transparent, conductive oxide.

The rod structure is formed of a transparent material. In one embodiment, the transparent material comprises a transparent conductive oxide including ITO, ZnO, AZO, GZO, $In_2O_3$, $SnO_2$, or a combination of them. In another embodiment, the transparent material comprises SiN, $SiO_2$, $TiO_2$, $Al_2O_3$, or a combination of them.

The rod structure is formed by a process of chemical vapor deposition (CVD), evaporation, sputtering deposition, hydrothermal deposition, photolithography, etching, or thermal oxidation. In one embodiment, the rod structure is formed by the process comprising evaporation or sputtering under a temperature in a range of about 25-400° C., and a flow rate of oxygen at a range of about 0-10 sccm.

In one embodiment, the rod structure comprises a plurality of rods distanced from each other. The plurality of rods has an averaged distance in a range of about 10-1000 nm, an average diameter in a range of about 10-1000 nm, and an average height in a range of about 10-2000 nm.

In one embodiment, the plurality of rods is formed surrounding the second-type electrode and the first-type electrode, respectively. In another embodiment, the plurality of rods is formed in the contact layer. In yet another embodiment, the plurality of rods is formed in the exposed area of the first-type semiconductor layer. In an alternative embodiment, the plurality of rods is formed in the exposed area of the first-type semiconductor layer and surrounding the first-type electrode.

In yet a further aspect, the present invention relates to a light emitting device. In one embodiment, the light emitting device includes an epi layer having multiple layers of semiconductors formed on a substrate, a first electrode and a second electrode having opposite polarities with each other, and electrically coupled to corresponding semiconductor layers, respectively, of the epi layer, and a rod structure formed on the epi layer.

In one embodiment, the epi layer includes a buffer layer formed of InAlGaN on the substrate, a first-type semiconductor layer formed of n-type InAlGaN on the buffer layer, an active layer having MQWs, formed on the first-type semiconductor layer, and a second-type semiconductor layer formed of p-type InAlGaN on the active layer, where the first-type semiconductor layer has an exposed area and uncovered by the active layer and the second-type semiconductor layer.

The light emitting device also includes a contact layer formed of a transparent conductive oxide on the second-type semiconductor layer. The first electrode is an n-electrode formed on the exposed area of the first-type semiconductor layer, and the second electrode is a p-electrode formed on the contact layer. The rod structure is formed on at least one of the contact layer and the exposed area of the first-type semiconductor layer.

In another embodiment, the epi layer includes a buffer layer formed on the substrate, a distributed Bragg reflector (DBR) layer formed on the buffer layer, a first-type semiconductor layer formed of n-type InAlGaP on the DBR layer, an active layer having MQWs, formed on the first-type semiconductor layer, a second-type semiconductor layer formed of p-type InAlGaP on the active layer, and a light extraction layer formed of InAlGaP on the second-type semiconductor layer.

The light emitting device further includes a contact layer formed of a second-type semiconductor of ITO or a semiconductor of AuBe on the light extraction layer. The first electrode is an n-electrode formed on the substrate, and the second electrode is a p-electrode formed on the contact layer. The rod structure is formed on a portion of the contact layer.

In yet another embodiment, the epi layer includes a first-type semiconductor layer formed of n-type GaN, a second-type semiconductor layer formed of p-type GaN, and an active layer having MQWs, formed between on the first-type and second-type semiconductor layers.

The light emitting device may also have a bonding layer formed on the substrate, a reflector formed on the bonding layer, and a transparent conductive layer formed on the reflector, where the second-type semiconductor layer of p-type GaN is formed on the transparent conductive layer. The rod structure is formed on the first-type semiconductor layer.

In an alternative embodiment, the epi layer includes a first-type semiconductor layer formed of n-type InAlGaP, a second-type semiconductor layer formed of p-type InAlGaP, and an active layer having MQWs, formed between on the first-type and second-type semiconductor layers, where the second-type semiconductor layer has an exposed area and uncovered by the active layer and the first-type semiconductor layer.

The light emitting device further has a contact layer formed of a transparent conductive oxide on the first-type semiconductor layer. The first electrode is an n-electrode formed on the contact layer, and the second electrode is a p-electrode formed on the exposed area of the second-type semiconductor layer and electrically connected to the ohmic contact layer through a via. The rod structure is formed on formed on at least one of the exposed area of the second-type semiconductor layer and the contact layer.

The rod structure is formed of a transparent material. In one embodiment, the transparent material comprises a transparent conductive oxide including ITO, ZnO, AZO, GZO, $In_2O_3$, $SnO_2$, or a combination of them. In another embodiment, the transparent material comprises SiN, $SiO_2$, $TiO_2$, $Al_2O_3$, or a combination of them.

The rod structure is formed by a process of chemical vapor deposition (CVD), evaporation, sputtering deposition, hydrothermal deposition, photolithography, etching, or thermal oxidation. In one embodiment, the rod structure is formed by the process comprising evaporation or sputtering under a temperature in a range of about 25-400° C., and a flow rate of oxygen at a range of about 0-10 sccm.

In one embodiment, the rod structure comprises a plurality of rods distanced from each other. The plurality of rods has an averaged distance in a range of about 10-1000 nm, an average diameter in a range of about 10-1000 nm, and an average height in a range of about 10-2000 nm.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
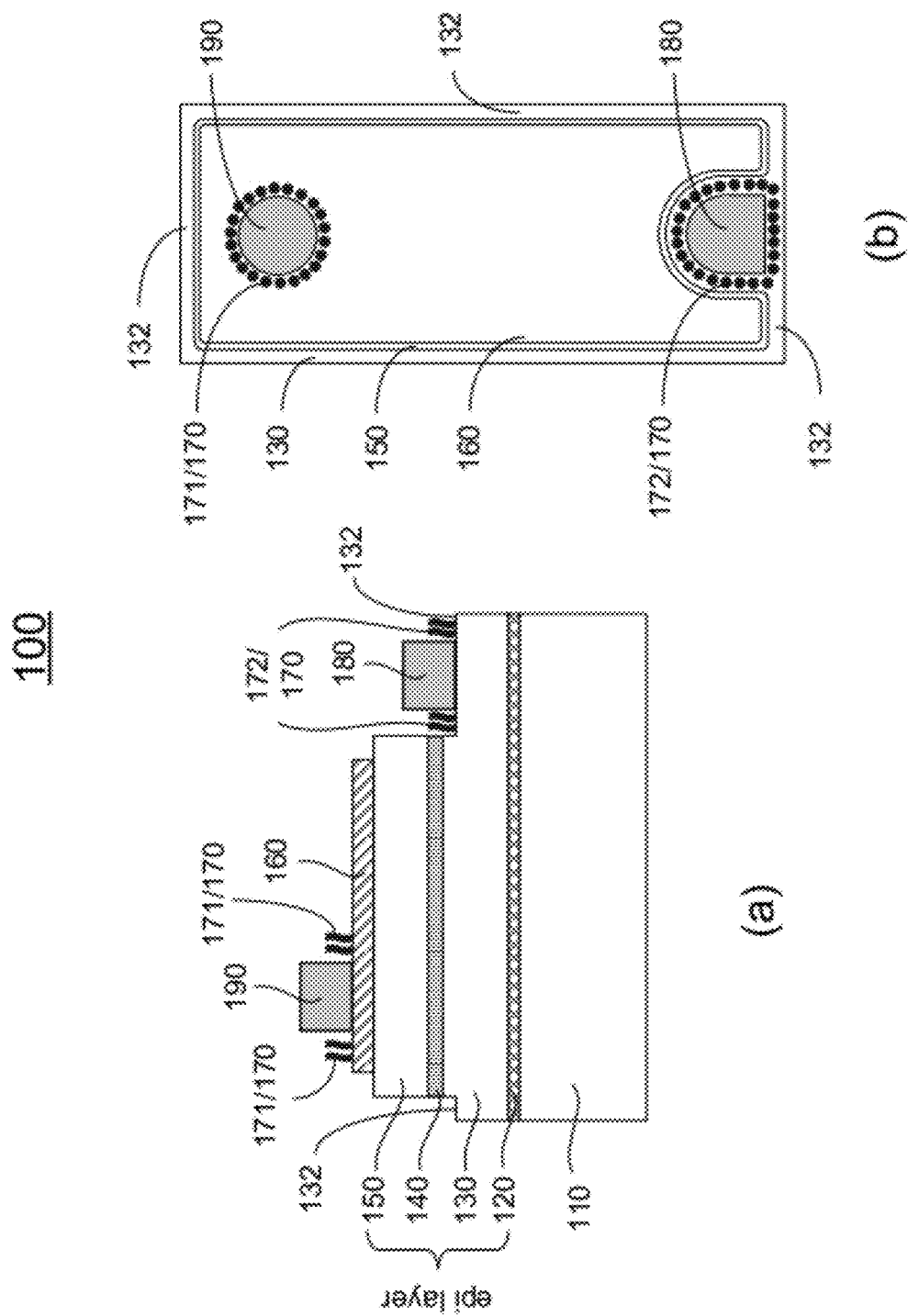
FIG. 1 shows schematically a light emitting device according to one embodiment of the present invention, (a) a cross-sectional view, and (b) a top view.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "layer", as used herein, refers to a thin sheet or thin film.

The term "electrode", as used herein, is an electrically conductive layer or film formed of one or more electrically conductive materials.

As used herein, the term "ohmic contact" refers to a region on a semiconductor device that has been prepared so that the current-voltage curve of the device is linear and symmetric.

The description will be made as to the embodiments of the present invention in conjunction with the accompanying drawings of FIGS. 1-11. In accordance with the purposes of this invention, as embodied and broadly described herein, this invention, in one aspect, relates to a light emitting device.

Figure 3:
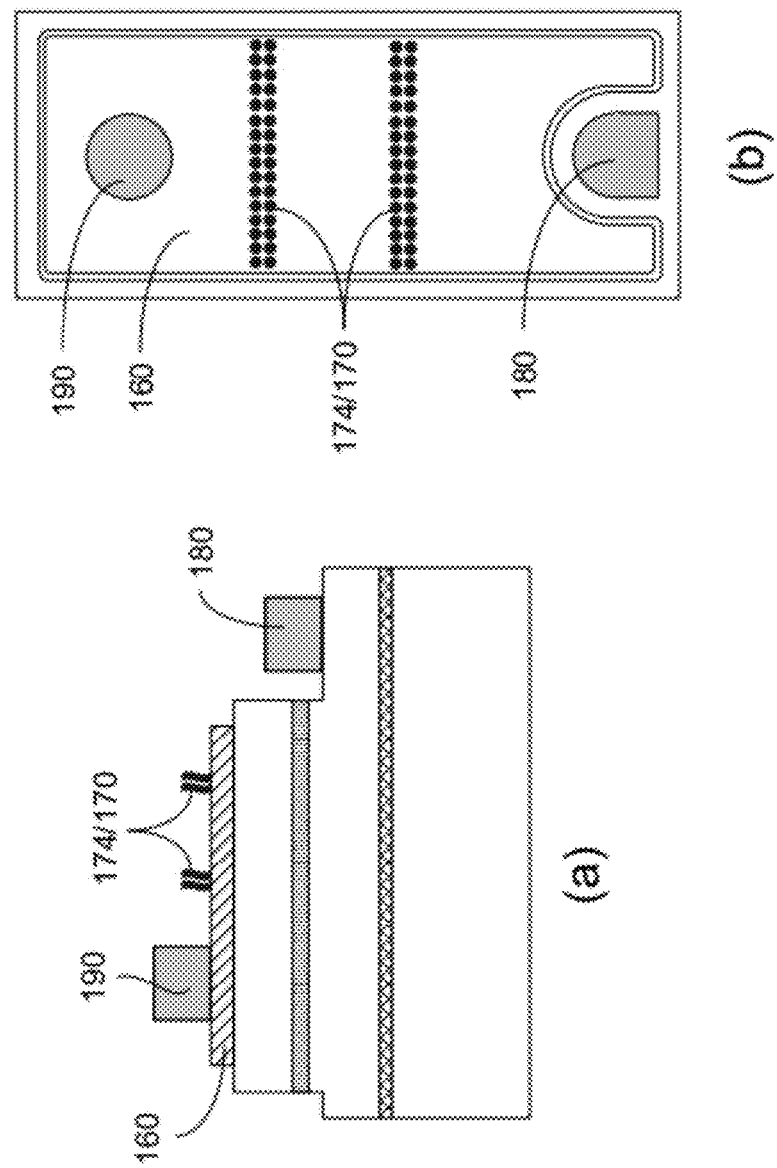
FIG. 3 shows schematically a light emitting device according to yet another embodiment of the present invention, (a) a cross-sectional view, and (b) a top view.
Figure 4:
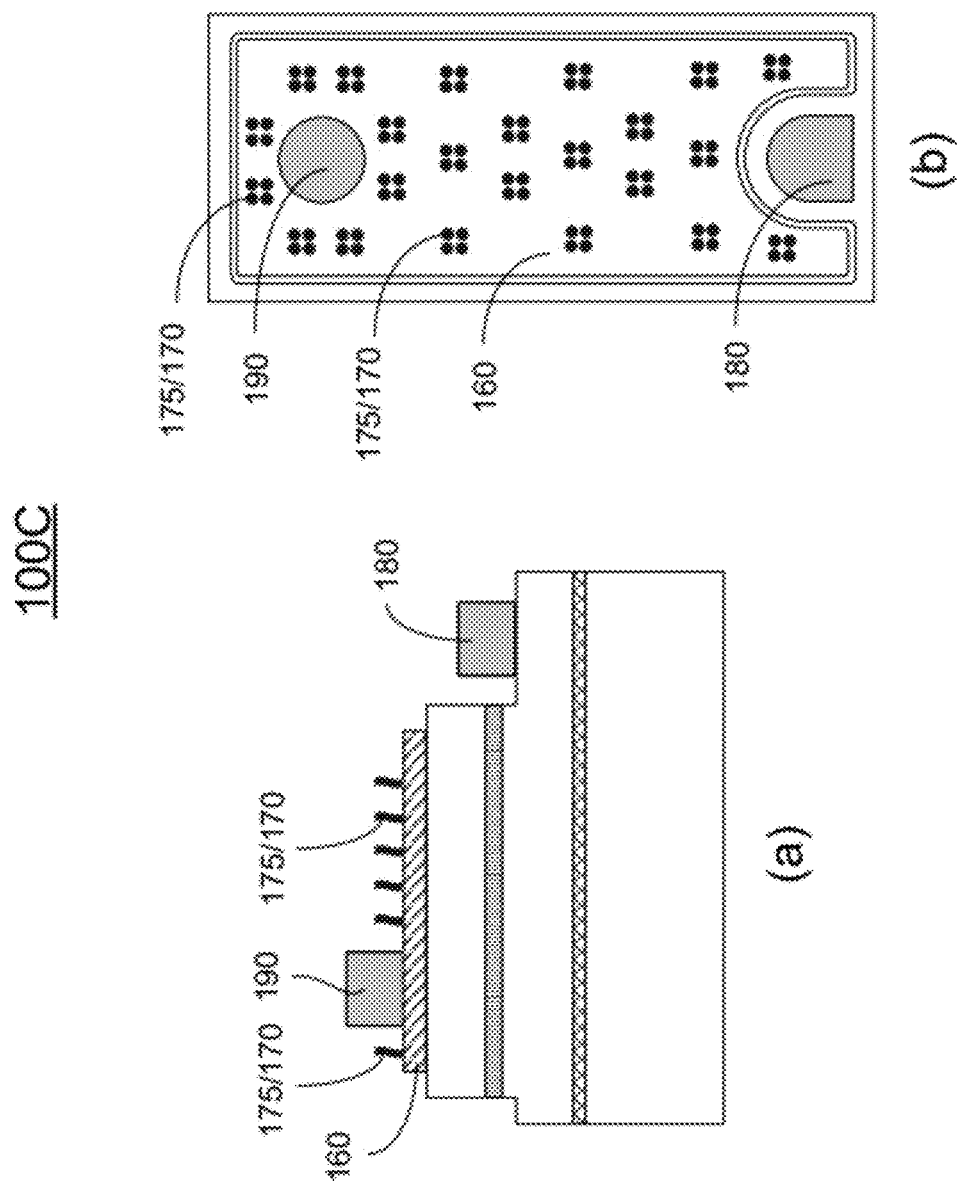
FIG. 4 shows schematically a light emitting device according to an alternative embodiment of the present invention, (a) a cross-sectional view, and (b) a top view.
Figure 5:
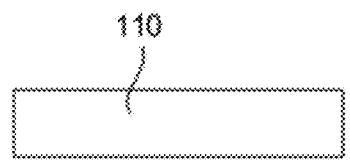
FIG. 5 shows schematically fabricating processes 5(a)-5(h) of the light emitting device shown in FIG. 1.
Figure 5:
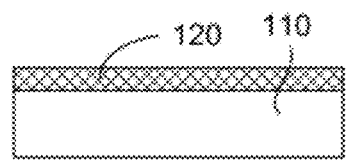
Figure 5:
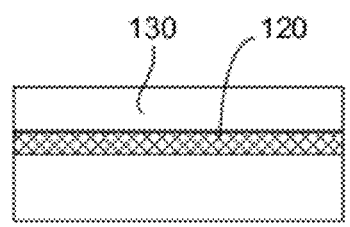
Figure 5:
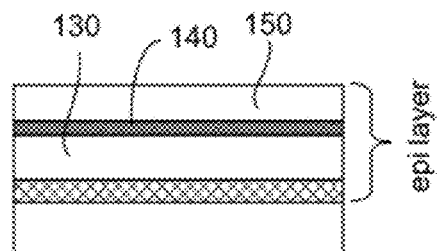
Figure 5:
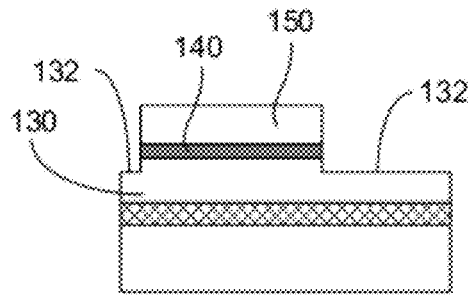
Figure 5:
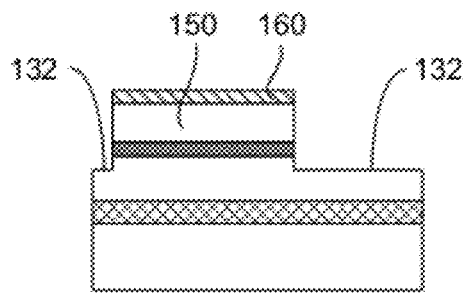
Figure 5:
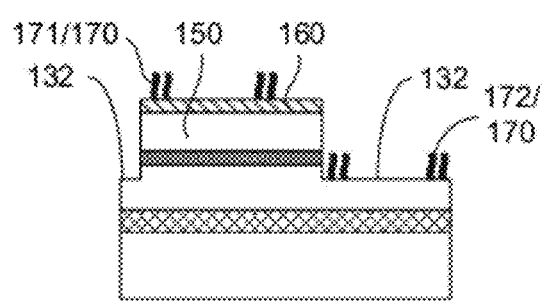
Figure 5:
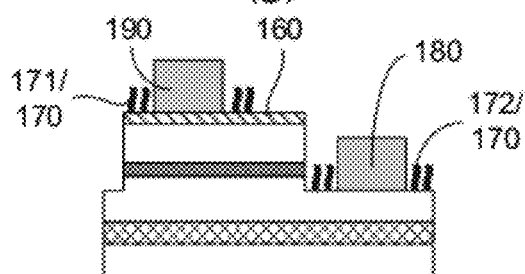

FIGS. 1-4 show various embodiments of a blue-light horizontal type light emitting device according to the present invention, and FIG. 5 shows a process of fabricating the same. Referring to FIGS. 1 and 5, the light emitting device 100 includes an epi layer, a contact layer 160, a rod structure 170, a first-type electrode 180, and a second-type electrode 190. The epi layer includes a buffer layer 120, a first-type semiconductor layer 130, an active layer 140 and a second-type semiconductor layer 150.

In fabrication of the light emitting device 100, a substrate 110 is provided, as shown in FIG. 5(a). The substrate 110 can be formed by any known or later developed substrate materials, such as, for example, sapphire (i.e. $Al_2O_3$), silicon carbide (SiC), silicon, or gallium arsenide (GaAs). The epi layer is then formed on the substrate 100, as shown in FIGS. 5(b)-5(d). Since the lattice mismatch occurs between the substrate 110 and the semiconductor material, at least one buffer layer 120 is required to form on the substrate 110. Specifically, the epi layer is formed by forming the buffer layer 120 on the substrate 110, forming the first-type semiconductor layer 130 on the buffer layer 120, forming the active layer 140 on the first-type semiconductor layer 130, and then forming the second-type semiconductor layer 150 formed on the active layer 140, as shown in FIGS. 5(b)-5(d).

The buffer layer 120 is formed of un-doped AlN in one embodiment. The buffer layer 120 may be formed including GaN, InGaN, AlGaN or AlN. The first-type semiconductor layer 130 is formed of n-type InAlGaN. The second-type semiconductor layer 150 is formed of p-type InAlGaN. The active layer 140 comprises one or more layers having MQWs. Other semiconductors can also be utilized to practice the present invention.

Next, an etching process or one of other cutting processes is applied to the epi layer to etch off the second-type semiconductor layer 150 and the active layer 140 of the epi layer in the peripheral region so as to expose the first-type semiconductor layer 130 therein, as shown in FIG. 5(e). Accordingly, the exposed area 132 of the first-type semiconductor layer 130 is uncovered by the active layer 140 and the second-type semiconductor layer 150.

Then, a transparent conductive oxide, such as ITO, ZnO, AZO, GZO, $In_2O_3$, $SnO_2$, or the like, is deposited on the second-type semiconductor layer 150 to form the contact layer 160 thereon, as shown in FIG. 5(f).

The rod structure 170 is subsequently formed on the transparent conductive layer 160 and/or the exposed area 132 of the first-type semiconductor layer 130, as shown in FIG. 5(g).

In addition, the first-type electrode 180 is an n-electrode formed on the exposed area 132 of the n-type semiconductor layer 130, and the second-type electrode 190 is a p-electrode formed on the transparent conductive layer 160, as shown in FIG. 5(h).

According to the present invention, the rod structure 170 is formed of a transparent material. The transparent material includes a transparent conductive oxide such as ITO, ZnO, AZO, GZO, $In_2O_3$, $SnO_2$, or the like. Additionally, the transparent material may be SiN, $SiO_2$, $TiO_2$, $Al_2O_3$, or the like.

The rod structure 170 can be formed by a process of chemical vapor deposition (CVD), evaporation, sputtering deposition, hydrothermal deposition, photolithography, etching, thermal oxidation, or the like. For example, the transparent conductive oxide forming the rod structure 170 can be obtained by a process comprising evaporation or sputtering under a temperature in a range of about 25-400° C., and a flow rate of oxygen at a range of about 0-10 sccm. Or, the rod structure 170 can be obtained by photolithography and etching the transparent material which is formed by CVD (chemical vapor deposition), vapor deposition, sputtering or thermal oxidation.

The rod structure 170 includes a plurality of rods 171 and 172 distanced from each other. The plurality of rods 171 and 172 has an averaged distance in a range of about 10-1000 nm, an average diameter in a range of about 10-1000 nm, and an average height in a range of about 10-2000 nm. As shown in FIG. 1, the rods 171 are formed on the transparent conductive layer 160 and surround the p-electrode 190, while the rods 172 are formed on the exposed area 132 of the n-type semiconductor layer 130 and surround the n-electrode 180.

Figure 2:
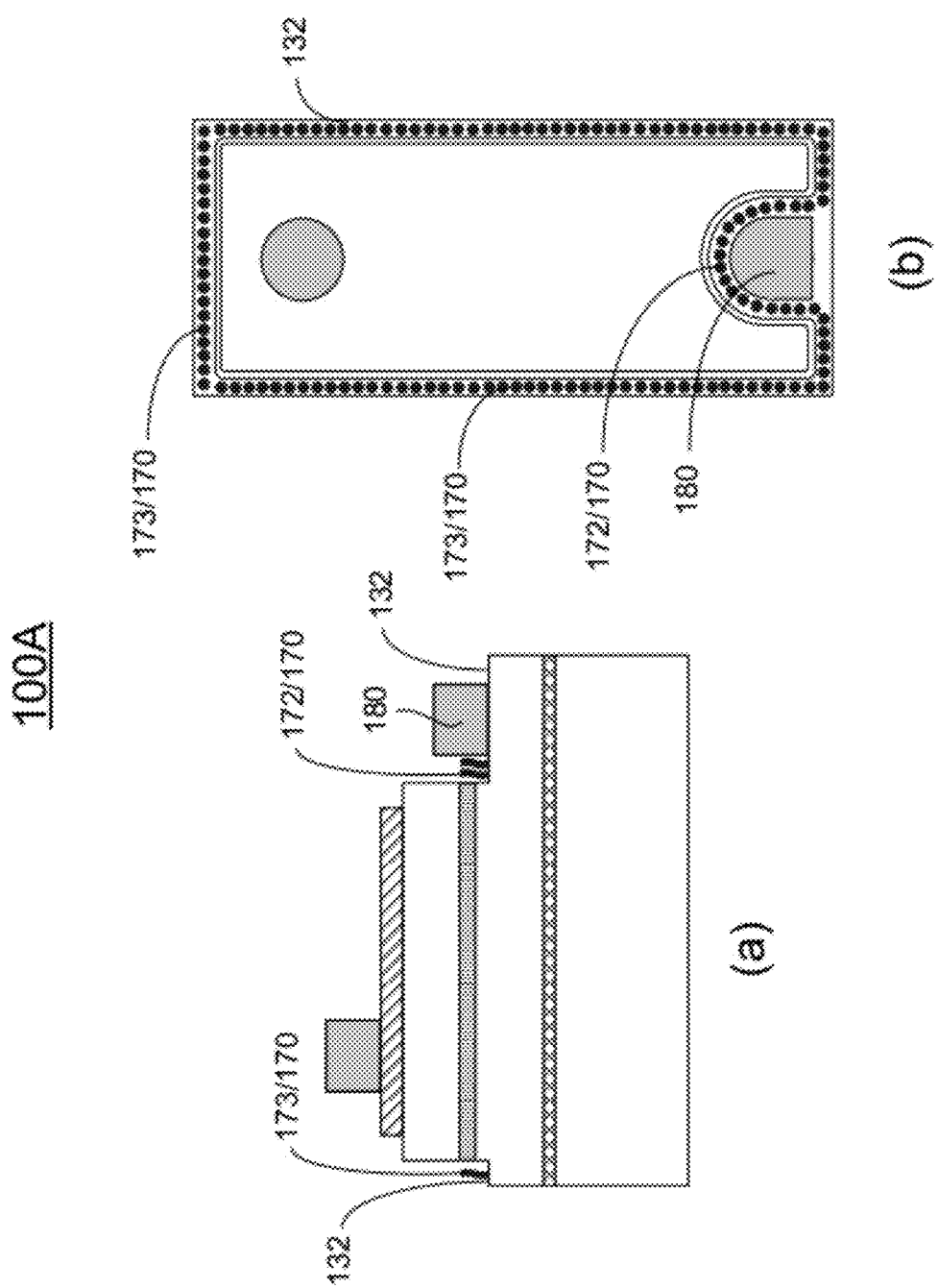
FIG. 2 shows schematically a light emitting device according to another embodiment of the present invention, (a) a cross-sectional view, and (b) a top view.

FIG. 2 shows a light emitting device 100A according to another embodiment of the present invention, which is similar to the light emitting device 100 shown in FIG. 1, except that the rod structure 170 includes a plurality of rods 172 and 173 formed on the exposed area 132 of the n-type semiconductor layer 130. The rods 172 surround partially the n-electrode 180, while the rods 173 are aligned along the peripherally exposed area 132 of the n-type semiconductor layer 130.

Referring to FIG. 3, an alternative embodiment of a blue-light horizontal light emitting device 100B is shown. The light emitting device 100B is similar to the light emitting device 100 shown in FIG. 1, except that the rod structure 170 includes a plurality of rods 174 formed on the transparent conductive layer 160. The rods 174 are arranged in a specific pattern, for example, of parallel rows.

FIG. 4 shows another embodiment of a blue-light horizontal light emitting device 100C. The light emitting device 100C is similar to the light emitting device 100B shown in FIG. 3, except that each four rods 175 are grouped in a square pattern, and squares are regularly arranged in a symmetric pattern in the transparent conductive layer 160.

Figure 6:
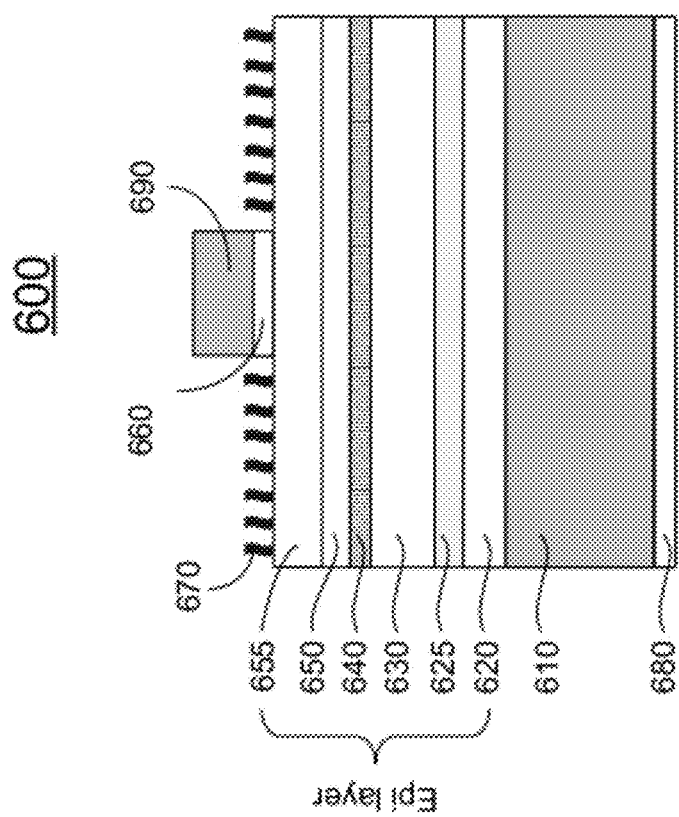
FIG. 6 shows schematically a light emitting device according to one embodiment of the present invention.

Referring to FIG. 6, a vertical type light emitting device 600 is shown according to another embodiment of the present invention. The light emitting device 600 includes an epi layer formed on a substrate 610. The epi layer has a buffer layer 620, a distributed Bragg reflector (DBR) layer 625, a first-type semiconductor layer 630, an active layer 640, a second-type semiconductor layer 650, and a light extraction layer 655 sequentially stacked together. The light emitting device 600 also includes a contact layer 660 formed on the light extraction layer 655, a rod structure 670 formed on light extraction layer 655, a first-type electrode 680 formed on the first surface 611 of the substrate 610, and a second-type electrode 690 formed on the contact layer 660.

Figure 7:
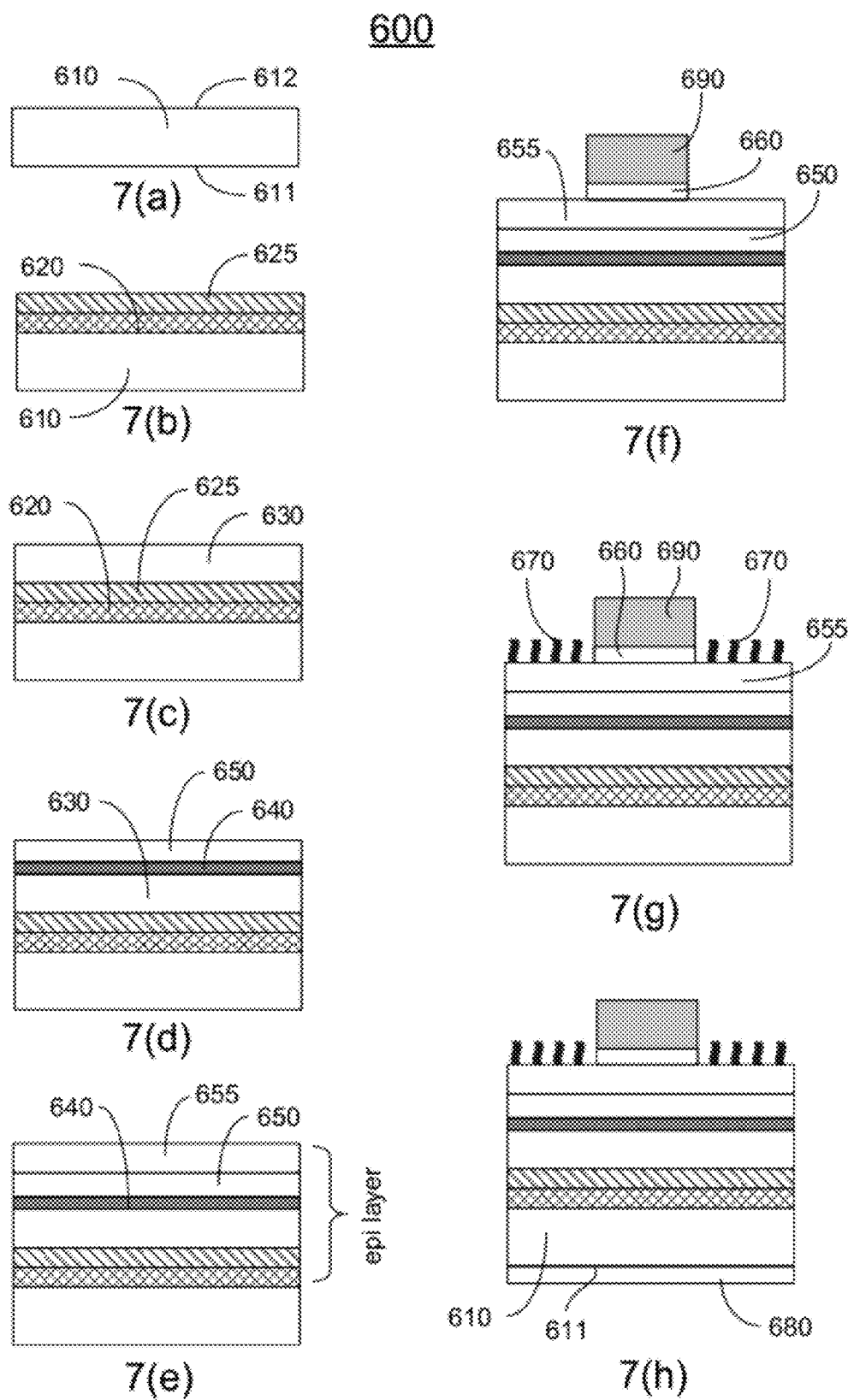
FIG. 7 shows schematically fabricating processed 7(a)-7(h) of the light emitting device shown in FIG. 6.

The fabricating process of the light emitting device 600 is shown in FIG. 7. At first, a conductive substrate 610 is provided, as shown in FIG. 7(a). The conductive substrate 610 can be formed by any known or later developed substrate materials, such as, for example, SiC or GaAs. The epi layer is then formed on the substrate 100, as shown in FIGS. 7(b)-7(e). More specifically, the epi layer is formed as follows: a buffer layer 620 is formed on the top surface 612 of the substrate 610. Then, a distributed Bragg reflector (DBR) layer 625 is deposited on the buffer layer 620. Subsequently, a first-type semiconductor layer 630 is formed on the DBR layer 625; an active layer 640 is formed on the first-type semiconductor layer 630; a second-type semiconductor layer 650 is formed on the active layer 640; and a light extraction layer 655 is formed on the second-type semiconductor layer 650.

In one example, the first-type semiconductor layer is formed of n-type InAlGaP, and the second-type semiconductor layer is formed of p-type InAlGaP. The active layer includes a multilayered structure having MQWs. The buffer layer 620 is formed including AlGaN, GaN, InGaN, AlGaN or AlN. The light extraction layer 655 can be formed of InAlGaP.

The contact layer 660, for example, is formed of ITO or AuBe on the light extraction layer 655 and the second-type electrode 690, a p-electrode, is formed on the contact layer 660, as shown in FIG. 7(f).

Next, the rod structure 670 is formed on the light extraction layer 655, as shown in FIG. 7(g). The rod structure 670 comprises a plurality of rods distanced from each other. The plurality of rods 670 has an averaged distance in a range of about 10-1000 nm, an average diameter in a range of about 10-1000 nm, and an average height in a range of about 10-2000 nm. The plurality of rods 670 is formed either surrounding the p-electrode 690, or a desired pattern on the light extraction layer 655.

The plurality of rods 670 is formed of a transparent material, such as SiN, $SiO_2$, $TiO_2$, $Al_2O_3$, or a transparent conductive oxide including ITO, ZnO, AZO, GZO, $In_2O_3$, $SnO_2$, or the like. The rod structure 670 is formed by a process of chemical vapor deposition (CVD), evaporation, sputtering deposition, hydrothermal deposition, photolithography, etching, or thermal oxidation. For example, the rod structure 670 is formed by the process comprising evaporation or sputtering under a temperature in a range of about 25-400° C., and a flow rate of oxygen at a range of about 0-10 sccm.

The n-electrode 680 is then formed on the bottom surface 611 of the substrate 610, as shown in FIG. 7(h).

Figure 8:
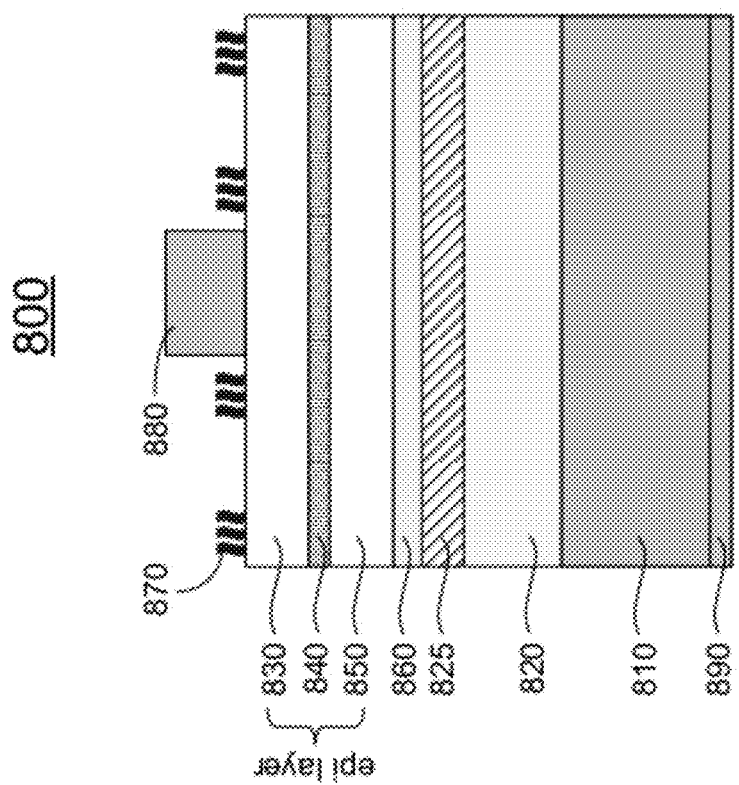
FIG. 8 shows schematically a light emitting device according to another embodiment of the present invention.
Figure 9:
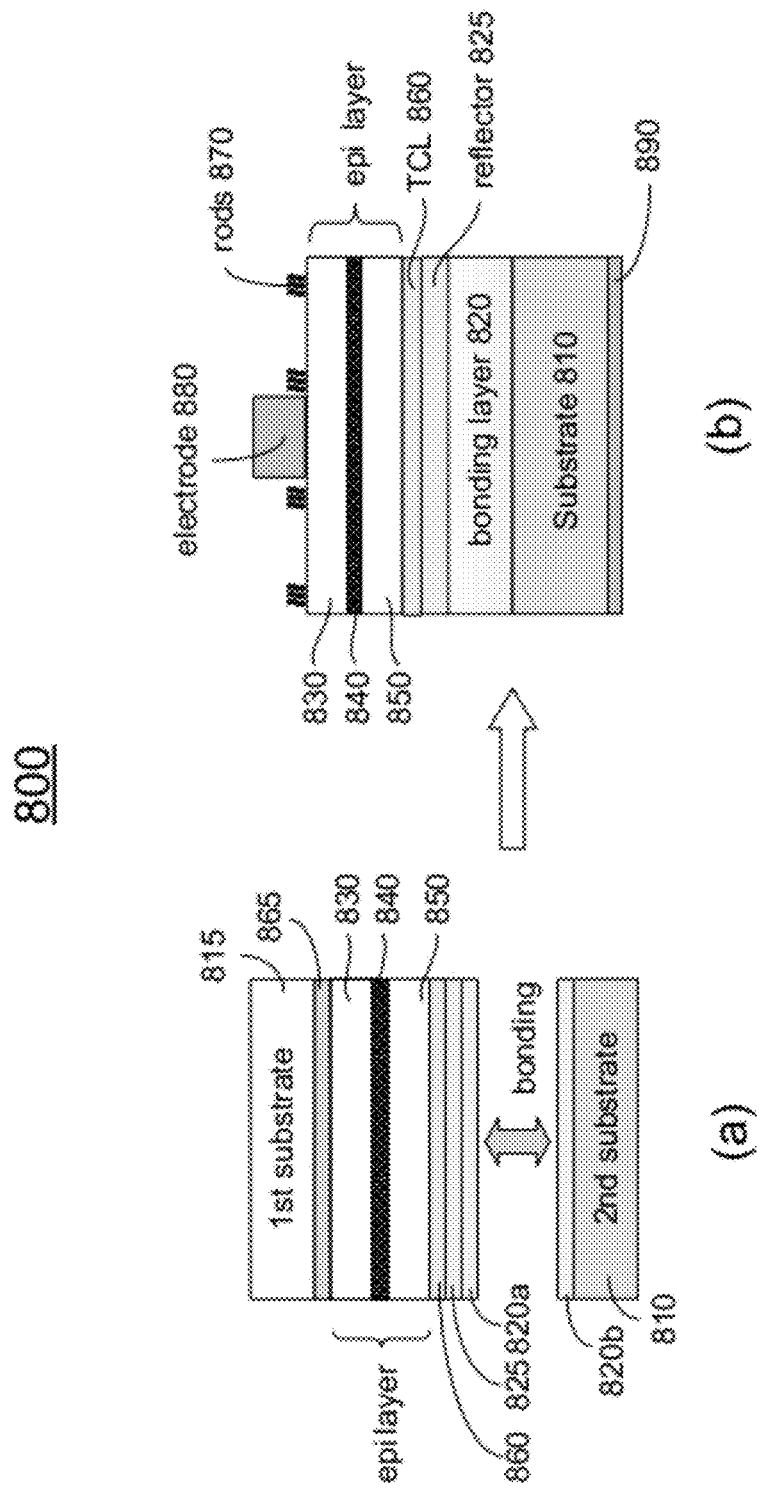
FIG. 9 shows schematically a fabricating process of the light emitting device shown in FIG. 8.

Referring to FIGS. 8 and 9, a blue-light vertical type light emitting device 800 and its fabricating process are respectively shown according to yet another embodiment of the present invention. The light emitting device 800 includes a substrate 810, a bonding layer 820 formed on the substrate 810, a reflector 825 formed on the bonding layer 820, a transparent conductive layer 860 formed on the reflector 825, and an epi layer having a second-type semiconductor layer 850 formed on the transparent conductive layer 860, an active layer 840 provided on the second-type semiconductor layer 850, and a first-type semiconductor layer 830 provided on the active layer 840.

The first-type semiconductor layer 830, the second-type semiconductor layer 850 and the active layer 840 constitutes an epi layer. The first-type semiconductor layer 830 is formed of n-type InAlGaN. The second-type semiconductor layer 850 is formed of p-type InAlGaN. The active layer 840 comprises MQWs.

In fabrication, in one embodiment shown in FIG. 9(a), a multilayered epitaxial structure is formed on a first substrate 815. A buffer layer 865 of un-doped GaN or un-doped AlN is deposited on the first substrate 815. The epi layer having the first-type semiconductor layer 830 of n-type InAlGaN deposited on the buffer layer 865, the active layer 840 deposited in turn on the first-type semiconductor layer 830, and the second-type semiconductor layer 850 of p-type InAlGaN deposited in turn on the active layer 840. The transparent conductive layer 860 is formed on the second-type semiconductor layer 850. Then, a reflector 825 is formed on the transparent conductive layer 860. On the top of the reflector 825, a first bonding layer 820a is formed.

Additionally, a second substrate 810 having a surface coated with a second bonding layer 820b is provided. The second substrate 810 is formed of a conductive material.

The next process is to bond the second substrate 810 with the multilayered epitaxial structures, such that the first bonding layer 820a is bonded with the second bonding layer 820b to form the bonding layer 820.

Then, the first substrate 825 is removed from the bonded structure by, for example, laser lift-off technique to dissolve buffer layer 865, such that the multilayered epitaxial structure is completely transferred from the first substrate 815 to the second substrate 810. Additionally, remaining buffer layer 865 after laser lift-off process will be removed by etching process, such as ICP etching.

Further, the rod structure 870 is formed on the first-type semiconductor layer 830, the first-type electrode 880 electrically coupled to the first-type semiconductor layer 830, and the second-type electrode 890 is formed on the other surface of the substrate 810 and electrically coupled to the second-type semiconductor layer 850, as shown in FIG. 9(b).

Similarly, the rod structure 870 includes a plurality of rods distanced from each other, which is formed by a process of chemical vapor deposition (CVD), evaporation, sputtering deposition, hydrothermal deposition, photolithography, etching, or thermal oxidation. The plurality of rods 870 has an averaged distance in a range of about 10-1000 nm, an average diameter in a range of about 10-1000 nm, and an average height in a range of about 10-2000 nm. The plurality of rods 870 is formed either surrounding the n-electrode 880.

Figure 10:
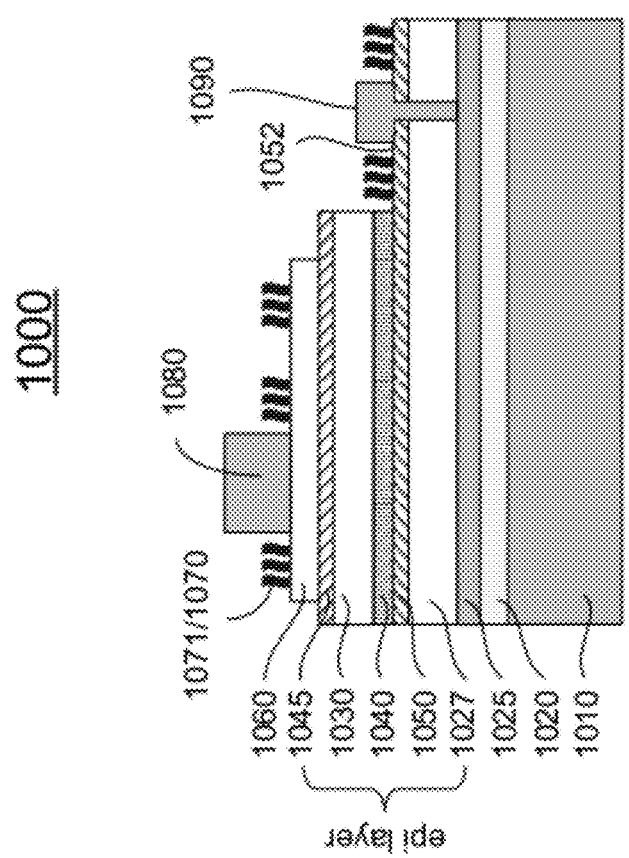
FIG. 10 shows schematically a light emitting device according to a further embodiment of the present invention.
Figure 11:
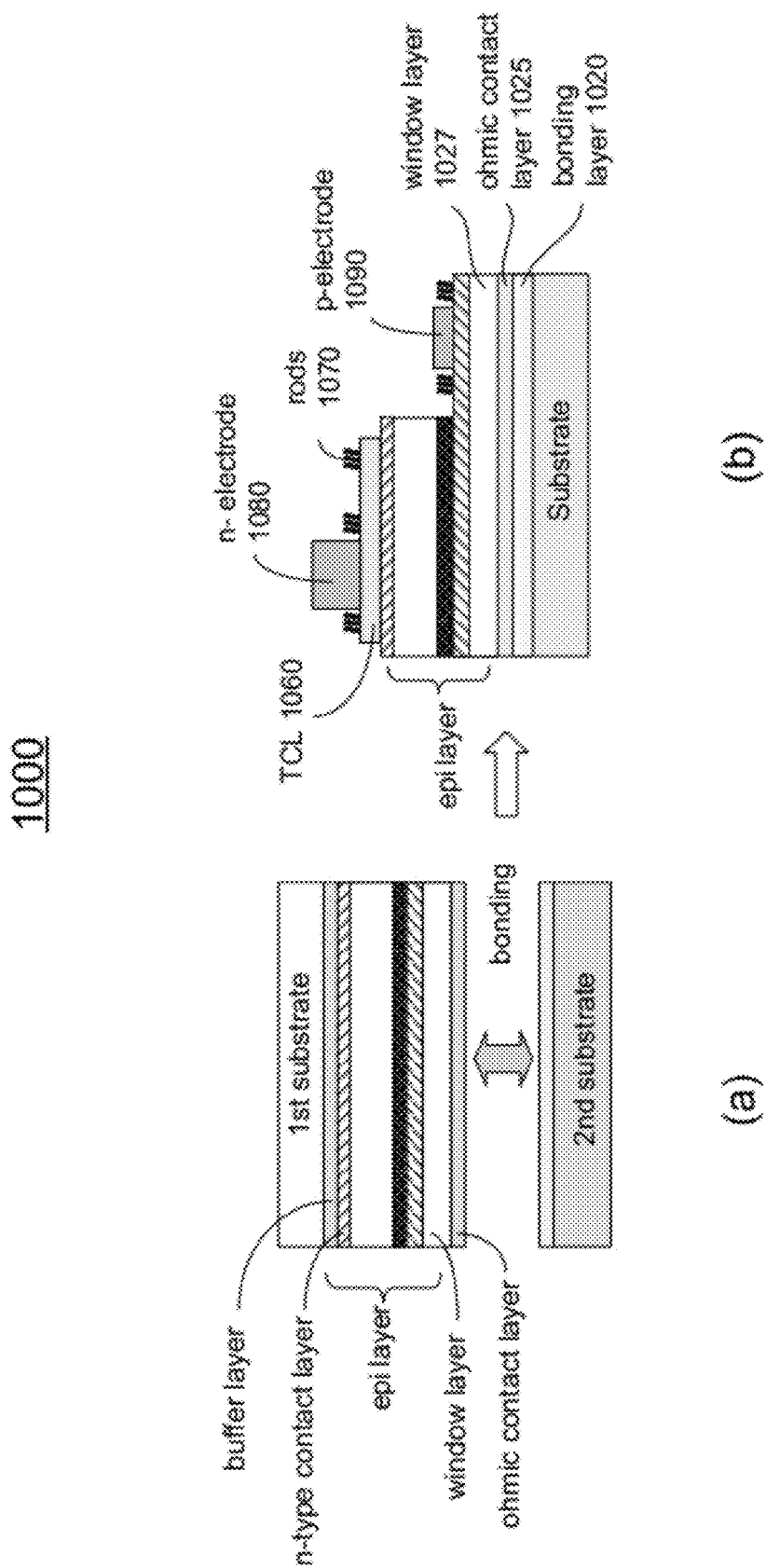
FIG. 11 shows schematically a fabricating process of the light emitting device shown in FIG. 10.

FIG. 10 shows one embodiment of a horizontal type light emitting device 1000 according to the present invention. The fabricating process of the horizontal light emitting device 1000, as shown in FIG. 11, is similar to that of the emitting device 800 shown in FIG. 9. A multilayered epitaxial structure is formed on a first substrate, which is bonded to a second substrate 1010 having a surface coated with the bonding layer 1020. Then, the first substrate is removed from the bonded structure by removing the buffer layer on the first substrate, and the multilayered epitaxial structure is completely transferred from the first substrate to the second substrate 1010.

More specifically, the light emitting device 1000 includes a substrate 1010, a bonding layer 1020 formed on the substrate 1010, a second ohmic contact layer 1025 formed on the bonding layer 1020, an epi layer formed on the first ohmic contact layer 1025 and a first ohmic contact layer 1045 on the epi layer. The first ohmic contact layer 1045 can be made of, for example, AuBe.

The epi layer includes a light extraction layer (window layer) 1027, a second-type semiconductor layer 1050 formed on the ohmic contact layer 1025, an active layer 1040 formed on the second-type semiconductor layer 1050 and a first-type semiconductor layer 1030 formed on the active layer 1040. The epi layer can be formed by epitaxially and sequentially growing a p-type semiconductor, for example, light extraction layer 1027 formed of InAlGaP, on the second ohmic contact layer 1025, p-type InAlGaP, on the light extraction layer 1027, MQWs on the p-type semiconductor, and an n-type semiconductor, i.e., n-type InAlGaP, on the MQWs. The epi layer may be formed by other processes.

Subsequently, an etching process or one of other cutting processes is applied to the epi layer to etch off the first ohmic contact layer 1045, the first-type semiconductor layer 1030 and the active layer 1040 of the epi layer in the peripheral region so as to expose the second-type semiconductor layer 1050 therein. Accordingly, the exposed area 1052 of the second-type semiconductor layer 1050 is uncovered by the active layer 1040 and the first-type semiconductor layer 1030. Additionally, a via 1055 is also formed on the exposed area 1052 by the etching process, which passes through the second-type semiconductor layer 1050, the light extraction layer 1027 to reach top surface of the ohmic contact layer 1050.

A transparent conductive oxide, such as ITO, ZnO, AZO, GZO, $In_2O_3$, $SnO_2$, or the like, is then deposited on the first-type semiconductor layer 1030 to form the transparent conductive layer 1060 thereon.

Next, a rod structure 1070 is formed on at least one of the exposed area 1052 of the second-type semiconductor layer 1050 and the transparent conductive layer 1060.

Further, a first-type electrode 1080 is formed on the transparent conductive layer 1060, and a second-type electrode 1030 is formed on the exposed area 1052 of the second-type semiconductor layer 1050 and electrically connected to the ohmic contact layer 1025 through the via 1055.

The rod structure 1070 is formed of a transparent material including SiN, $SiO_2$, $TiO_2$, or $Al_2O$, or a transparent conductive oxide, such as ITO, ZnO, AZO, GZO, $In_2O_3$, $SnO_2$, or the like. The rod structure 1070 is formed by a process of chemical vapor deposition (CVD), evaporation, sputtering deposition, hydrothermal deposition, photolithography, etching, or thermal oxidation. For example, the rod structure 1070 may be formed by the process of evaporation under a temperature in a range of about 25-400° C., and a flow rate of oxygen at a range of about 0-10 sccm.

The rod structure 1070 includes a plurality of rods 1071 and 1072 distanced from each other. The plurality of rods 1071 and 1072 has an averaged distance in a range of about 10-1000 nm, an average diameter in a range of about 10-1000 nm, and an average height in a range of about 10-2000 nm. As shown in FIG. 10, the rods 1071 are formed on the transparent conductive layer 1060 and surround the n-electrode 1080, while the rods 1072 are formed on the exposed area 1052 of the p-type semiconductor layer 1050 and surround the p-electrode 1090.

Briefly, the present invention, among other things, recites a light emitting device having an epi layer having multiple layers of semiconductors and a rod structure formed on the epi layer to improve the light extraction efficiency.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A light emitting device, comprising:
   a substrate;
   a buffer layer formed on the substrate;
   a first-type semiconductor layer formed on the buffer layer;
   an active layer formed on the first-type semiconductor layer such that the first-type semiconductor layer has an exposed area;
   a second-type semiconductor layer formed on the active layer;
   a contact layer formed of a transparent conductive material on the second-type semiconductor layer;
   a rod structure formed on the contact layer;
   a second-type electrode formed on the contact layer such that the second-type electrode has no portion overlapping with the rod structure; and a first-type electrode formed on the exposed area of the first-type semiconductor layer.

2. A light emitting device, comprising:
an epi layer having multiple layers of semiconductors formed on a substrate, wherein the epi layer comprises:
a buffer layer formed on the substrate;
a first-type semiconductor layer formed of n-type GaN based material on the buffer layer;
an active layer formed on the first-type semiconductor layer; and
a second-type semiconductor layer formed of p-type GaN based material on the active layer,
wherein the first-type semiconductor layer has an exposed area and uncovered by the active layer and the second-type semiconductor layer;
a first electrode and a second electrode having opposite polarities with each other, and electrically coupled to corresponding semiconductor layers, respectively, of the epi layer;
a contact layer formed of a transparent conductive oxide on the second-type semiconductor layer; and
a rod structure formed on the contact layer and the exposed area of the first-type semiconductor layer,
wherein the first electrode is an n-electrode formed on the exposed area of the first-type semiconductor layer, and the second electrode is a p-electrode formed on the contact layer; and
wherein the rod structure is formed surrounding the second electrode and the first electrode, respectively.

3. The light emitting device of claim 2, wherein the rod structure is formed in a desired pattern in the contact layer.

4. The light emitting device of claim 2, wherein the rod structure is formed of a transparent material.

5. The light emitting device of claim 4, wherein the transparent material comprises a transparent, conductive oxide including ITO, ZnO, AZO, GZO, $In_2O_3$, $SnO_2$, or a combination of them.

6. The light emitting device of claim 4, wherein the transparent material comprises SiN, $SiO_2$, $TiO_2$, $Al_2O_3$, or a combination of them.

7. The light emitting device of claim 2, wherein the rod structure is formed by a process comprises evaporation, sputtering deposition, hydrothermal deposition, photolithography, etching, or thermal oxidation.

8. The light emitting device of claim 7, wherein the rod structure is formed by the process comprising evaporation or sputtering under a temperature in a range of about 25-400° C. and a flow rate of oxygen at a range of about 0-10 sccm.

9. The light emitting device of claim 2, wherein the rod structure comprises a plurality of rods distanced from each other.

10. The light emitting device of claim 9, wherein the plurality of rods has an averaged distance in a range of about 10-1000 nm, an average diameter in a range of about 10-1000 nm, and an average height in a range of about 10-2000 nm.

11. The light emitting device of claim 1, wherein the rod structure is formed on the contact layer and the exposed area of the first-type semiconductor layer.

12. The light emitting device of claim 1, wherein the rod structure comprises a plurality of rods distanced from each other.

13. The light emitting device of claim 12, wherein the plurality of rods has an averaged distance in a range of about 10-1000 nm, an average diameter in a range of about 10-1000 nm, and an average height in a range of about 10-2000 nm.

14. A method of forming a light emitting device, comprising:
forming a buffer layer on a substrate;
forming a first-type semiconductor layer on the buffer layer;
forming an active layer on the first-type semiconductor layer;
forming a second-type semiconductor layer on the active layer;
removing a part of the active layer and a part of the second-type semiconductor layer such that the first-type semiconductor layer has an exposed area;
forming a contact layer of a transparent conductive material on the second-type semiconductor layer;
forming a rod structure on at least one of the contact layer and the exposed area of the first-type semiconductor layer;
forming a first-type electrode formed on the exposed area of the first-type semiconductor layer; and
forming a second-type electrode on the contact layer such that the second-type electrode has no portion overlapping with the rod structure.

15. The method of claim 14, wherein the rod structure comprises a plurality of rods distanced from each other.

16. The method of claim 14, wherein the rod structure is formed surrounding the second electrode and the first electrode, respectively.

17. The method of claim 14, wherein the rod structure is formed in the exposed area of the first-type semiconductor layer and surrounding the first electrode.

* * * * *